July 8, 1969 HIROHIKO TONARI ET AL 3,453,896

COMBINED VHF-UHF TUNER

Filed Aug. 18, 1967 Sheet 1 of 4

INVENTORS
HIROHIKO TONARI
AKIO HASHIMA

BY Wenderoth, Lind & Ponack
ATTORNEYS

INVENTORS
HIROHIKO TONARI
AKIO HASHIMA

BY, Wenderoth, Lind & Ponack,
ATTORNEYS

INVENTORS
HIROHIKO TONARI
AKIO HASHIMA

BY Wenderoth, Lind & Ponack
ATTORNEYS

INVENTORS
HIROHIKO TONARI
AKIO HASHIMA

BY Wenderoth, Lind & Ponack,
ATTORNEYS

United States Patent Office

3,453,896
Patented July 8, 1969

3,453,896
COMBINED VHF–UHF TUNER

Hirohiko Tonari, Moriguchi-shi, and Akio Hashima, Kyoto-shi, Japan, assignors to Matsushita Electric Industrial Co. Ltd., Madoma, Osaka, Japan

Filed Aug. 18, 1967, Ser. No. 661,624
Int. Cl. F16h *35/18*
U.S. Cl. 74—10.8 13 Claims

ABSTRACT OF THE DISCLOSURE

A combined VHF–UHF television tuner, designed to eliminate backlash and to provide a combined tuner which is compact and easy to operate. Said tuner comprises: a VHF tuner, including a channel selecting means provided with a rotor shaft and including vernier tuning means for adjusting the fine tuning of said VHF tuner; a UHF tuner including a tuning shaft for selecting one of a plurality of UHF television channels; and, a clutch means including a clutch device and a clutch actuating device. Said combined VHF–UHF tuner, also comprises a pair of shafts. One of said shafts is connected to said rotor shaft and to said clutch actuating device; the other shaft is coupled directly with said vernier tuning means and with said tuning shaft through said clutch device. Said clutch device intermits the engagement between the other shaft and said tuning shaft and is driven by said clutch actuating device.

BACKGROUND OF THE INVENTION

*Field of the invention*

The present invention relates to a VHF-UHF television tuner and, more particularly, to a VHF–UHF channel selector and indicator mechanism.

DESCRIPTION OF THE PRIOR ART

Under present standards, a television set is required to receive signals of both the VHF television band and the UHF television band. It must also have a smail cabinet and a large picture tube. Therefore, it is necessary that a television tuner act as a VHF tuner as well as a UHF tuner. It must be compact and easy to operate.

Usually, a VHF tuner used to select channels in the VHF television band, contains a channel selector knob having the VHF channel numbers printed thereon. It also contains a fine tuning knob used to achieve a fine tuning at each rotative position of said channel selector knob. A UHF tuner, used to select the channels in the UHF television band, contains a channel selector knob and a UHF channel indicator. Since there is no need to achieve fine tuning of the VHF tuner when receiving UHF television signals, it is convenient to use the fine tuning knob of the VHF tuner as a channel selector knob for the UHF tuner.

U.S. Patent 3,285,078 discloses a tuning mechanism having a single fine tuning knob which enables the fine tuning of the VHF channels and the selection of channels in the UHF band. With this tuning mechanism, the selection of a UHF channel can be accomplished by rotating the fine tuning knob. Said knob is not engaged with the fine tuning means for the VHF channels when the VHF channel selector knob is positioned at the UHF tuner selecting position. A fine tuning can be achieved for the VHF band by rotating the fine tuning knob in a movement along the axis thereof while the VHF channel selector knob is set in a position for a VHF channel. The movement of the fine tuning knob in an axial direction causes the fine tuning knob to engage with the fine tuning mechanism for the VHF channels and causes the fine tuning knob to disengage from the UHF tuner. Such a tuning mechanism, according to the U.S. patent, has a disadvantage in that the operation requires not only the rotation of the knob but also movement in an axial direction. In addition, such a mechanism is complicated and bulky because the fine tuning knob engages only intermittently with the UHF tuner and with the fine tuning means of the VHF tuner.

Further, in another conventional combined VHF–UHF tuner, the fine tuning knob engages with the vernier tuning means of the VHF tuner or with the tuning shaft of the UHF tuner through a clutch means without the axial movement of said fine tuning knob. In such a case, the backlash which is apt to be caused by the clutch means makes it difficult to operate the fine tuning knob for the VHF channels and causes difficulty in selecting the channels in the UHF band. It results in a poor response to manual manipulation during operation unless the combined VHF–UHF tuner is specifically provided with means to eliminate such backlash.

SUMMARY OF THE INVENTION

A principal object of this invention is to provide a new, combined VHF–UHF tuner which is free from the disadvantages mentioned above.

A further object of the invention is to provide a new VHF–UHF televition tuner which enables the fine tuning of the VHF and the selection of the UHF television bands by the rotation of a single fine tuning knob. Said knob is not required to move in an axial direction.

Another object of the invention is to provide an improved VHF–UHF television tuner which is characterized by its ease of operation in the fine tuning of the VHF channels and in the selection of the UHF channels. Said tuner is also miniaturized.

These objectives are achieved by the combined VHF–UHF tuner of the present invention. Said tuner comprises: a VHF tuner, including a channel selecting means provided with a rotor shaft and including vernier tuning means for adjusting the fine tuning of said VHF tuner; a UHF tuner including a tuning shaft for selecting one of a plurality of UHF television channels; and, a clutch means including a clutch device and a clutch actuating device. Said combined VHF–UHF tuner also comprises a pair of shafts. One of said shafts is connected to said rotor shaft and to said clutch actuating device; the other shaft is coupled with said vernier tuning means directly and with said tuning shaft through said clutch device. Said clutch device intermits the engagement between the other shaft and said tuning shaft. It is driven by said clutch actuating device.

BRIEF DESCRIPTION OF THE DRAWINGS

The present invention will now be described together with the accompanying drawings wherein.

Figure 1:
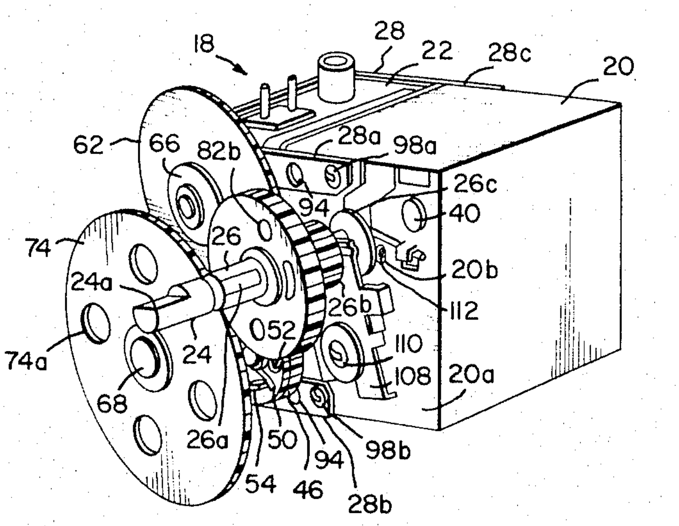
FIGURE 1 is a front perspective view of a preferred embodiment of the invention; knobs and indicator dials have been taken off for the sake of clarity.
Figure 2:
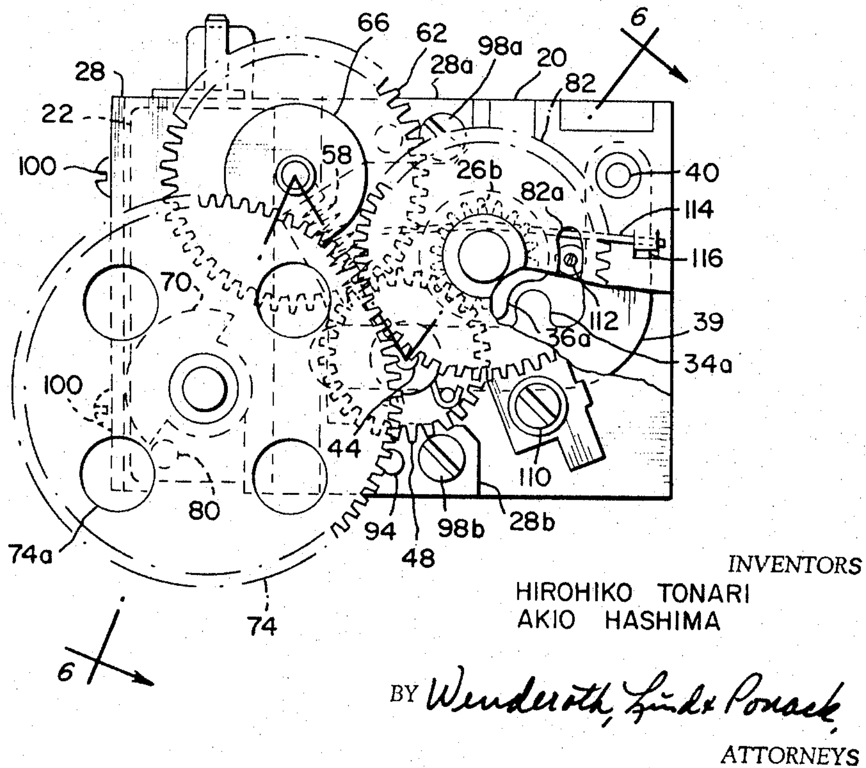
FIGURE 2 is an elevational view of the tuner of FIG-
Figure 3:
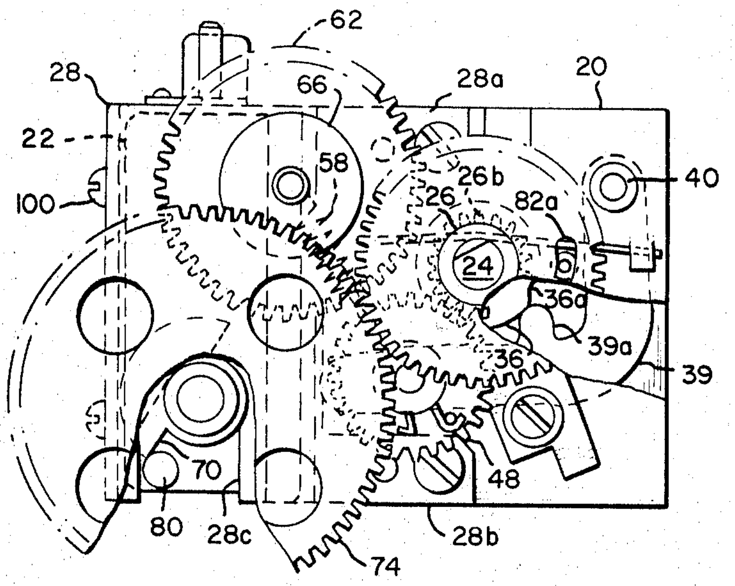
Figure 4:
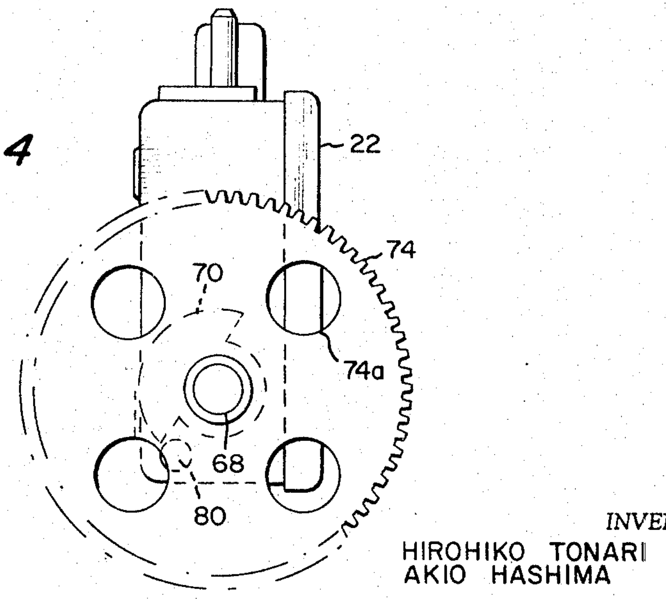
Figure 5:
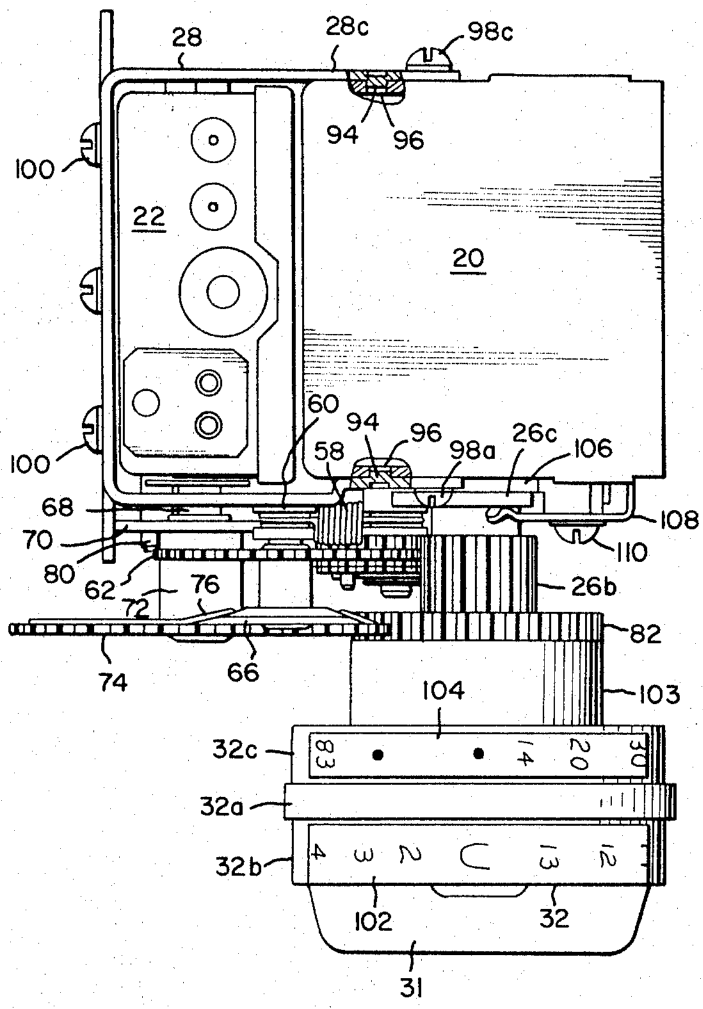
Figure 6:
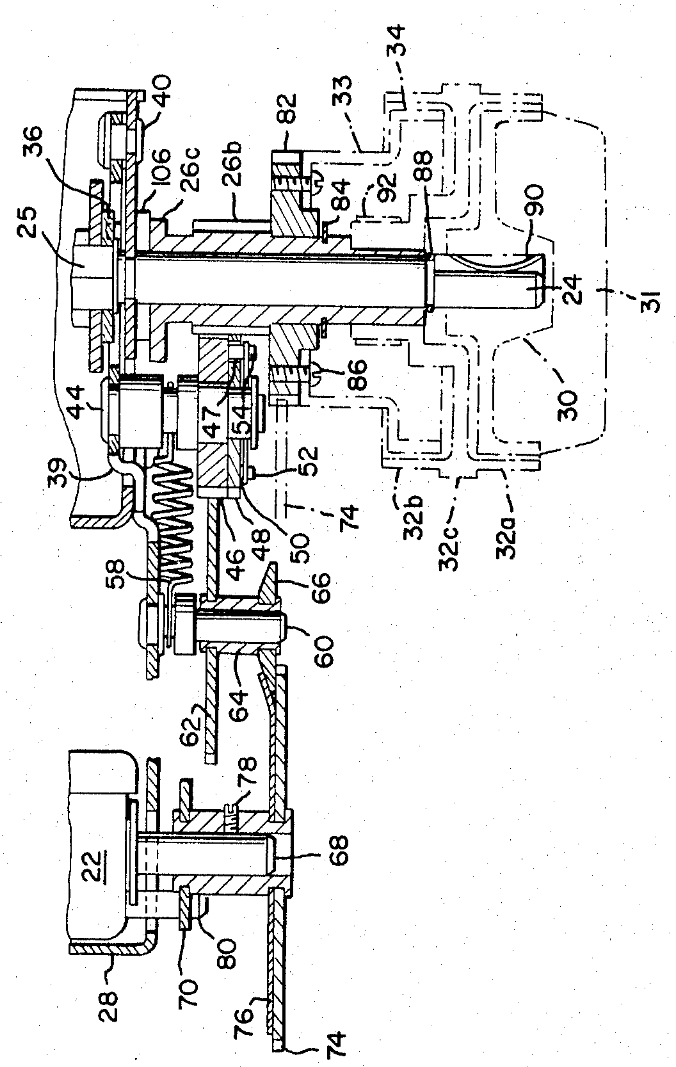

URE 1, showing the gear train as it appears during the UHF tuning;

FIGURE 3 is an elevational view of the tuner of FIGURE 1, with certain parts broken away, as it appears during the VHF fine tuning;

FIGURE 4 is an elevational view of the UHF tuner taken off from the frame to which it is secured by means of screws;

FIGURE 5 is a top plan view of the tuner of FIGURE 1 including the mounted knobs and indicator dials; and FIGURE 6 is stretched sectional view taken along the irregular line 6—6 of FIGURE 2.

DESCRIPTION OF THE PREFERRED EMBODIMENT

The essence of the present invention will be briefly described before preceding with the detailed description of the invention.

The present invention concerns a combined VHF–UHF tuner comprising a VHF tuner including a channel selecting means provided with a rotor shaft and including a vernier tuning means for adjusting the fine tuning of the VHF tuner, a UHF tuner, including a tuning shaft for selecting one of a plurality of UHF television channels, clutch means, including a clutch device and a clutch actuating device, and a pair of shafts. One shaft of said pair of shafts is directed to said rotor shaft and to said clutch actuating means, and the other of said pair of shafts is coupled directly with said vernier tuning means and with said tuning shaft through said clutch device.

Said clutch device intermits the engagement between the other shaft and said tuning shaft in such a way that the other shaft is engaged with or disengaged from said tuning shaft by said clutch device. Said clutch device is driven by said clutch actuating device.

In the present invention, said clutch device is constructed more simply and more completely than the clutch devices found in the prior art. This is due to the said other of said pair of shafts being directly coupled with said vernier tuning means.

This direct coupling of said other shaft with said vernier tuning means results in another advantage, that is, the easy operation of the VHF fine tuning mechanism resulting from the absence of backlash between said shaft and said vernier tuning means.

The construction of the present invention can eliminate these disadvantages of the combined VHF–UHF tuners found in the prior art. Referring to FIGURES 1 thru 6, the combined VHF–UHF tuner 18 comprises a switch type VHF tuner 20, a UHF tuner 22, and a frame 28 which combines the tuners 20 and 22. Said VHF tuner includes a channel selecting means having a rotor shaft 25 which is connected to an inner shaft 24. The rotation of the rotor shaft 25 provides a selection among the various VHF channel positions and the UHF tuner position. Said VHF tuner 20 contains a variable capacitor type vernier tuning means comprising a dielectric plate **26*c* and capacitor plates 106 and 108. Said dielectric plate 26*c* is directly connected to an outer shaft 26 and can be rotated in accordance with the rotation of said outer shaft 26. Said outer shaft 26 is rotatably mounted on said inner shaft 24 and, together with said inner shaft 24, forms a pair of shafts. The connection between said dielectric plate 26*c* and said outer shaft 26 can be achieved by a conventional and suitable securing method, for example, by using any suitable adhesive material such as epoxy resin or phenol resin. Preferably said dielectric plate 26*c* and said outer shaft 26 are formed into one body by using a suitable dielectric material such as polyacetal or polycarbonate resin. Said dielectric plate 26*c* is in the 26*c*, sandwiched between said capacitor plates 106 and 108. The change in said area causes a change in the capacitance of the variable capacitor. Since the circuit constant of the fine tuning circuit of the VHF tuner 20 varies with the variation in capacitance of said variable capacitor, the rotation of said outer shaft 26** enables the fine tuning of the VHF channels.

Said UHF tuner 22 is provided with a tuning shaft 68 which enables said tuner to cover some seventy channels of the UHF band by rotation of said shaft through one half of a rotation.

Said combined VHF–UHF tuner 18 is provided with a linkage mechanism, which makes it possible to rotate said tuning shaft 68, at a reduced rate, by rotating said outer shaft 26 when said inner shaft 24 is in the UHF tuner selecting position. FIGURE 2 shows the linkage mechanism in this state.

Said linkage mechanism is provided with a pinion gear **26*b*, a clutch means and a transmitting means in order that any one of a plurality of UHF channels, can be selected by rotating said outer shaft 26. Said pinion gear 26*b* and said dielectric plate 26*c* are attached to said outer shaft 26**. Said clutch means comprises a clutch device and a clutch actuating device for driving said clutch device.

Said clutch actuating device comprises a clutch cam 36 which has a recess **36*a* therein, as shown in FIGURE 2, and which is secured to said inner shaft 24. Said clutch device comprises an L shaped clutch lever 39, split gears 46 and 48 and a helical spring 58 for actuating said clutch lever 39. Said clutch lever 39 is pivoted, at one end, on the vertical front panel 20*a* of said VHF tuner about a stud 40. A stud 44 is secured to the other end of said clutch lever 39 and has split gears 46 and 48 mounted rotatably thereon, as shown in FIGURE 6. Said split gears 46 and 48 are in a meshing engagement with said pinion gear 26*b*. Said clutch lever 39 has a projecting portion 39*a* which is always in contact with the periphery of said clutch cam 36**.

Said transmitting means includes an idler gear 62, disc 66 having an inclined face, a thin elastic disc 76 and a large gear 74. Referring to FIGURE 6, said idler gear 62 and said disc 66 are secured to the opposite ends of an idler sleeve 64 which is rotatably mounted on a stud 60 secured to the frame 28. A sleeve 72 is securely fastened to said tuning shaft 68 of the UHF tuner by a set screw 78. The large gear 74 and the thin elastic disc 76 are secured to one end of said sleeve 72 and a sector plate 70 is secured to the other end of said sleeve 72. Said thin elastic disc 76 is preferably made of a spring metal such as steel or Phosphor bronze. The disc 66 is in frictional engagement between said thin elastic disc 76 and said large gear 74 in order to establish a driving connection between the idler gear 62 and the tuning shaft 68. Said tuning shaft 68 rotates within the limits established by a stud 80 which extends from the UHF tuner 22 to the cut out of said sector plate 70. The clutch cam 36 is securely fastened to the inner shaft 24.

As shown in FIGURE 3, said clutch lever 39 is biased clockwise by said helical spring 58, so that said projecting portion **39*a* of the clutch lever 39 is in contact with the periphery of the clutch cam 36 when said inner shaft 24** is in a VHF channel selecting position.

When said inner shaft 24 is turned to the UHF channel selecting position from a VHF channel selecting position, said clutch cam 36 is positioned such the projecting portion **39*a* of the clutch lever 39 falls into said recess 36*a* of said clutch cam 36. FIGURE 2 shows the split gear 46 meshed with the idler gear 62. This engagement causes the rotational motion of the outer shaft 26 to be transmitted through said pinion gear 26*b*, said split gears 46, 48, said idler gear 62, and said disc 66 to said large gear 74 of said UHF tuning shaft 68** at a speed reduction ratio of about 8 to 1.

Such a large reduction ratio of 8 to 1 between said outer shaft 26 and said tuning shaft 68 facilitates the channel selection of said UHF tuner 22.

After said tuning shaft 68 has been rotated to the limit established by the stud 80 on the sector plate 70, further rotation of said outer shaft 26 in the same direction causes frictional slip between said disc 66 and frictionally engaged between said large gear 74 and said thin elastic disc 76.

As shown in FIGURE 3, when said inner shaft 24 is turned to the VHF channel selecting position from the UHF channel selecting position, said clutch cam 36 raises said projecting portion 39*a* of said clutch lever 39 against the action of said helical spring 58, so that said clutch lever 39 is swung counter clockwise about said stud 40. This swing motion causes said split gear 46 to disengage from said idler gear 62 but does not cause said pinion gear 26*b* to be disengaged from said split gears 46, 48.

Accordingly when said inner shaft 24 is in a VHF channel selecting position, the rotational motion of said outer shaft 26 cannot drive said turning shaft 68 of the UHF tuner 22, but it still rotates said dielectric plate 26*c* to accomplish the fine tuning of the selected VHF channel.

Thus, said outer shaft 26 is coupled with said UHF tuning shaft 68 when said inner shaft is in the UHF tuner selecting postiion and is disengaged from said tuning shaft 68 when said inner shaft 24 is in a VHF channel selecting position.

In order to indicate the UHF channel selected in the case when said inner shaft 24 is positioned for the UHF band, the combined VHF–UHF tuner 18 has a UHF channel indicator 33 which is coaxial with said shafts 24 and 26. This coaxial arrangement of the UHF channel indicator and the channel selecting knob 30 is not only convenient for the operator, but it also facilitates a smaller cabinet and a larger picture tube arrangement for the television set.

As shown in FIGURE 6, said UHF channel indicator 33 includes a dial gear 82 and a UHF indicator dial 34 on which UHF channel numbers are suitably printed. Said UHF indicator dial 34 is securely fastened to said dial gear 82 by two screws 86.

Said dial gear 82 is rotatably mounted on said outer shaft 26. A stop ring 84, locked to said outer shaft 26, prevents said dial gear 82 from being removed from said shaft 26. Said dial gear 82, having a gear ratio of 2 to 1 to said large gear 74, is in a continuous meshing engagement with said large gear 74 and is rotated at a rate of about one turn during a half of a revolution of said tuning shaft 68 of said UHF tuner 22. Since said thin elastic disc 76 has a diameter not larger than the diameter of the root circle of said large gear 74, said dial gear 82 meshes with said large gear 74 at the center of the face width of dial gear 82. This ensures reliable engagement or connection between said large gear 74 and said dial gear 82 even when a slight plane distortion exists in the large gear. Said UHF indicator dial 34 is easily removed from said dial gear 82 by unscrewing said screws 86. Such easy removal facilitates an exchange of the UHF indicator dial 34.

The combined VHF–UHF tuner 18 can be operated by a channel selecting knob 30 and a fine tuning knob 32. The channel selecting knob 30 is secured to a flattened portion 24*a* on said inner shaft 24 by a retaining spring 90 and may be gripped, at a portion 31 thereof, by the operator in order to rotate said inner shaft 24 to any desired position.

Said fine tuning knob 32 is secured to the flattened portion 26*a* of said outer shaft 26 by a retaining spring 92. The operator grips said knob, at the milled portion 32*c* in order to rotate said outer shaft 26.

When said channel selecting knob 30 is positioned for selecting one of the twelve channels in the VHF band, rotating said fine tuning knob 32 rotates said dielectric plate 26*c* so as to finely tune to the selected VHF channel. When said channel selecting knob 30 is in the UHF tuner selecting position, rotating said fine tuning knob 32 rotates not only said dielectric plate 26*c*, but it also rotates said UHF indicator dial 34 through split gears 46 and 48, idler gear 62 and gear 74 at a speed reduction ratio of about 4 to 1. Since said fine tuning knob 32 covers said UHF indicator dial 34 with the transparent drum portions 32*a* and 32*b*, the rotation of said UHF indicator dial 34 at a rate reduced with respect to said fine tuning knob 32, is not interrupted by the finger of the operator.

As shown in FIGURES 3 to 6 the combined VHF-UHF tuner contains a frame 28 to which said VHF tuner 20 and said UHF tuner 22 are connected. Suitable relative positions are determined by a positioning device which includes projecting portions 94 on frame 28 and cavity portions 96 in that VHF tuner casing and the frame is secured by the screws 98 to the VHF tuner and by screws 100 to the UHF tuner. The frame 28 has lug portions 28*a*, 28*b*, 28*c* and 28*d* (not shown), each of which has a projecting portion 94 to fit into said cavity portions 96 of said VHF tuner 20. Said frame 28 can be positioned at a position predetermined by the location of the cavity portions 96 and secured to the VHF tuner 22 by screws 98*a*, 98*b*, 98*c* and 98*d*. Even when screws 98*a*, 98*b*, 98*c* and 98*d* are loosened, there is no variation in the positions of said inner shaft 24 and said tuning shaft 68 because of the tight fit between said projecting portion 94 and said cavity portions 96. The UHF tuner can be attached to said frame 28 after said sector plate 70 is securely held at a given angle of said tuning shaft 68. Said sector plate 70 and said large gear 74 are secured to said sleeve 72. Said large gear 74 meshes with said dial gear 82 and simultaneously is in frictional driving contact with the annular sloping surface on disc 66. This invention requires the insertion of said disc 66 between said large gear 74 and said thin elastic disc 76. The construction in such a way can easily be accomplished by the invention as shown in the following embodiment.

Said large gear 74 has openings 74*a* therein. A suitable gap can be formed between said large gear 74 and said thin elastic disc 76 by imparting a force to said thin elastic disc 76 through said opening 74*a* by means of a screw driver or the like. The edge of disc 66 can be satisfactorily inserted into said gap.

As shown in FIGURES 3 and 4, said frame 28 is provided with a cut out portion 28*c*. Said UHF tuner 22 (as shown in FIGURE 4), together with said large gear 74, can easily be removed from said frame 28 without disassembling the entire unit by unscrewing said screws 100 and removing said tuner 22 in the direction in which said cut out portion 28*c* opens out of the frame.

When backlash occurs between the fine tuning knob 32 and said vernier tuning means of said VHF tuner 20 or in the linkage between said fine tuning knob 32 and said tuning shaft 68 of said UHF tuner 22, the operation of the fine tuning for the VHF channels or the selecting of channels in the UHF band becomes difficult. In addition, the fine tuning knob 32 does not rotate smoothly and such an unsmooth rotation lowers the selling price of the tuner.

The removal of the undesirable backlash can be accomplished in accordance with the invention as follows. Said fine tuning knob 32 is tightly fitted on said outer shaft 26 which with said dielectric plate 26*c* forms a single unit. Such construction does not generate any undesirable backlash in the operation of the fine tuning knob 32 for the VHF channels. When said channel selector knob 30 is in the UHF tuner selecting position, said split gears 46 and 48 engage with said idler gear 62 so as to transmit the rotation of said fine tuning knob 32 to said tuning shaft 68 as shown in FIGURE 2. Said split gear 48 is provided with a stud 52 and a stud 54 is attached to said split gear 46 through a cutout portion 47 of the split gear 48 (FIGURES 1 and 6). A U-shaped wire spring 50 is connected between said studs 52 and 54 and is loaded so as to urge gears 46 and 48 to rotate in opposite directions resulting in the teeth of the split gears 46 and 48 being forced out of alignment with each other. Said gears 46 and 48 are restricted in their relative rotation by said stud 54 and by said cut-out portion 47 of said split gear 48. Said force, exerted by said spring compressed between studs 52 and 54, prevents the backlash between said pinion gear **26*b* and said split gears 46 and 48. The teeth of said gears are always meshed with the teeth of said pinion gear 26*b*. The teeth of gear 46 are engaged with the one side of the teeth of gear 26*b* and the teeth of gear 48 being engaged with the other sides of the teeth of gear 26*b***.

In spite of the meshing engagement between said idler gear 62 and said split gear 46, as shown in FIGURE 6, a sufficient contact caused by the bias of said helical spring 58, exists between the face of the teeth of said idler gear 62 and the face of the teeth of said split gear 46 to prevent backlash from occurring between said idler gear 62 and said split gear 46. Said disc 66 frictionally drives said large gear 74 while being pressed, on both faces, by said large gear 74 and said thin elastic disc 76 respectively. Since the face of said disc 66 which is in contact with said thin elastic disc 76, is shaped in an annular sloping form, said thin elastic disc 76 bends naturally along said contacting surface of said disc 66. Accordingly, the frictional coupling which exists between said thin elastic disc 76 and said disc 66 is so stable that said disc 66 can smoothly rotate said tuning shaft 68 together with said UHF indicator dial 34. With this construction there is no backlash between said pinion gear **26*b*, connected to said fine tuning knob 32, and said tuning shaft 68 of said UHF tuner 22**.

In addition, said disc 66, having an annular sloping face, facilitates the exchange or the resetting of the UHF tuner (FIGURE 4).

In order to adjust the local oscillating frequencies of the VHF channels, metal screw 112 is turned by means of a screw driver as is usually done for the VHF tuners found in the prior art. As shown in FIGURE 1, a vertical panel **20*a* of the VHF tuner is provided with an opening 20*b* located in a position where the metal adjusting screw 112 for the VHF channels which are to be adjusted are located. Said dial gear 82 also has an opening 82*a* such that the metal screw 112 is easily adjusted, by means of a screw driver being inserted through said openings 82*a* and 20*b***, without disassembling the entire unit.

The adjustment of said metal screw 112 must be carried out when the eccentric disc of said dielectric plate **26*c* is positioned at a specified angle with respect to said capacitor plates 106 and 108 of the vernier tuning means. When said dielectric plate 26*c* is properly positioned for said adjustment, it is not always possible to obtain the necessary coincidence between said opening 82*a* and said opening 20*b* of the vertical front panel 20*a*. The discrepancy between said two openings 82*a* and 20*b* prevents the screw driver from extending through said two openings 82*a* and 20*b*. The necessary coincidence between said opening 82*a* and said opening 20*b*** can be easily accomplished in accordance with the present invention by the following procedure.

Initially, said inner shaft 24 is set at the UHF tuner selecting position. Said fine tuning knob 32 is then rotated toward the left or the right so as to rotate said UHF tuning shaft 68 and said dial gear 82. The amount of rotation of said tuning shaft 68 is limited by the limits established by said section plate 70 and said stud 80. Said dial gear 82, driven by said UHF tuning shaft 68, stops at the position at which said opening **82*a* of said dial gear 82 is coincident with said opening 20*b* in said vertical panel 20*a*. However, the frictional driving means between said fine tuning knob 32 and said UHF tuning shaft 68 allows further rotation of said fine tuning knob 32 in the same direction. Said dielectric plate 26*c* always rotates together with the rotation of said fine tuning knob 32 and can thus be positioned at a suitable position by continuing to rotate said fine tuning knob 32 in the same direction. In such a way, one can easily bring said dielectric plate 26*c* into said suitable position and can also achieve the necessary coincidence between said opening 82*a* and said opening 20*b*. Finally, the metal screw can be turned so as to adjust the local oscillating frequencies of various VHF channels after said inner shaft 24** is rotated back to one of the VHF selecting positions.

What is claimed is:

1. A combined VHF–UHF tuner comprising: a VHF tuner including a channel selecting means having a rotor shaft and including vernier tuning means for adjusting the fine tuning of said VHF tuner; a UHF tuner including a tuning shaft to select one of a plurality of UHF television channels; clutch means including a clutch device and a clutch actuating device; a pair of shafts, one of which is connected to said rotor shaft and to said clutch actuating device, and the other of which has said vernier tuning means mounted thereon and is coupled indirectly with said tuning shaft through said clutch device, said clutch device intermitting the engagement between said other of the pair of shafts and said tuning shaft.

2. A combined VHF-UHF tuner as claimed in claim 1 in which said clutch device includes a pivoted clutch lever, split gear means freely rotatably mounted on said clutch lever, and a transmitting means including a transmitting gear coupled to said UHF tuning shaft and with which said split gear means engages and disengages during pivoting of said lever, said clutch actuating means is a clutch cam engaged with said clutch lever, said pair of shafts being coaxial, and the inner shaft being connected to said rotor shaft and to said clutch cam and the outer shaft having said vernier tuning means thereon and having a pinion gear thereon in engagement with said split gear means at all times, whereby when said inner shaft is located at a particular rotative position, the clutch lever is pivoted so that the split gear means is engaged with said transmitting gear and said combined VHF–UHF tuner rotates the tuning shaft for tuning signals of the UHF band.

3. A combined VHF–UHF tuner as claimed in claim 2 wherein the split gear means is two coaxial gears, and said pinion gear engages with the two gears of said split gears means while said transmitting gear engages with only one of said split gears.

4. A combined VHF–UHF tuner as claimed in claim 2 wherein said transmitting means further comprises disc having an annular sloping surface on one face thereof, and a thin elastic disc and a large gear having said disc thereon and coupled to said UHF tuning shaft, the annular sloping surface disc being engaged between said large gear and the elastic disc so as to drive said large gear and to rotate said UHF tuning shaft.

5. A combined VHF–UHF tuner as claimed in claim 4 wherein said elastic disc is no longer than the diameter of the root circle of said large gear.

6. A combined VHF–UHF tuner as claimed in claim 4 wherein said large gear has openings within its root circle.

7. A combined VHF–UHF tuner as claimed in claim 1 in which said pair of shafts are coaxial, and further comprising a UHF indicator which is coaxial relative to said pair of shafts and rotatable relative thereto and which is always coupled to said tuning shaft.

8. A combined VHF–UHF tuner as claimed in claim 7 in which said clutch device includes a large gear driven when said clutch device is actuated and geared to said UHF indicator for rotating it when said tuning shaft is rotated.

9. A combined VHF–UHF tuner as claimed in claim 7 wherein said UHF indicator consists essentially of UHF indicator dial and a dial gear on said UHF indicator dial with which said large gear is engaged.

10. A combined VHF–UHF tuner as claimed in claim 9 wherein said UHF indicator dial gear has an opening therein in order to provide access to metallic screws in the VHF tuner which adjust local oscillating frequencies of said VHF tuner.

11. A combined VHF–UHF tuner as claimed in claim 7 in which said outer shaft is connected directly to said vernier tuning means, and a transparent knob on said outer shaft which extends over and protects said UHF indicator when said outer shaft is operated.

12. A combined VHF–UHF tuner as claimed in claim 1 further comprising a frame for attaching said VHF tuner and said UHF tuner to each other, said tuners and said frame each having positioning means, thereon, one having projections thereon and the other having recesses into which said projections fit for positively locating the frame relative to the tuners.

13. A combined VHF–UHF tuner as claimed in claim 12 wherein said frame has a panel on one side having a recess opening out of the edge thereof through which the tuning shaft of the UHF tuner projects to permit removal of the UHF tuner fixed to said frame in the direction in which said recess opens after release of fastening means which connect the UHF tuner to said frame.

References Cited

UNITED STATES PATENTS

| | | | |
|---|---|---|---|
| 2,756,599 | 7/1956 | Sperber | 74—10.5 |
| 3,364,753 | 1/1968 | Bidlack | 74—10.45 |

MILTON KAUFMAN, *Primary Examiner.*

U.S. Cl. X.R.

74—10.6